United States Patent [19]

Yoshihara

[11] Patent Number: 4,782,003
[45] Date of Patent: Nov. 1, 1988

[54] PHOTO- AND PRESSURE-SENSITIVE RECORDING PAPER COMPRISING TWO TYPES OF MICROCAPSULES

[75] Inventor: Hideo Yoshihara, Kasugai, Japan

[73] Assignee: Brother Kogyo Kabushiki Kaisha, Nagoya, Japan

[21] Appl. No.: 36,070

[22] Filed: Apr. 9, 1987

[30] Foreign Application Priority Data

Apr. 10, 1986 [JP] Japan .................................. 61-80982

[51] Int. Cl.⁴ .......................... G03C 1/40; G03C 1/00
[52] U.S. Cl. .............................. 430/138; 427/213.31;
428/402.2; 428/402.21; 428/404.24; 428/407;
430/211; 430/962
[58] Field of Search ....................... 430/138, 211, 962;
427/213.31; 428/402.2, 402.21, 404.24, 407

[56] References Cited

U.S. PATENT DOCUMENTS 4,293,634 10/1981 Monosov ............................ 430/138
4,489,151 12/1984 Sanders et al. .................... 430/138
4,578,339 3/1986 Adkins ............................... 430/211

Primary Examiner—Mukund J. Shah
Attorney, Agent, or Firm—Kane, Dalsimer, Sullivan, Kurucz, Levy, Eisele and Richard

[57] ABSTRACT

Disclosed is photo- and pressure-sensitive recording paper which comprises a support coated with first microcapsules each enclosing contents including a substance which has hardness changeable corresponding to a quantity of light irradiation thereon and which includes a dye precursor, and with second microcapsules each enclosing a developer which is a thermoplastic substance, and further disclosed is a pressure developing apparatus suitable for pressure developing such photo- and pressure-sensitive recording paper as described above.

2 Claims, 1 Drawing Sheet

PHOTO- AND PRESSURE-SENSITIVE RECORDING PAPER COMPRISING TWO TYPES OF MICROCAPSULES

BACKGROUND OF THE INVENTION

1. Field of the Invention

The present invention relates to a photo- and pressure-sensitive recording paper and a pressure developing apparatus for developing the photo- and pressure-sensitive recording paper.

2. Description of the Prior Art

As recording paper to be used with a light imaging apparatus, there has been known recording paper coated with a layer of microcapsules each enclosing a substance which has hardness changeable by irradiation with light and which includes a dye precursor, for example, a photosetting substance or a photo-softening substance, and also coated with a developer. With the photo- and pressure-sensitive recording paper, a latent image is formed on the surface of the recording paper corresponding to the original and corresponding to the degrees of hardening or softening of the microcapsules, and then pressure is applied to the surface of the recording paper to destroy the microcapsules so that a reaction is caused between the dye precursor and the developer so as to make the latent image visible. In this process, undesirable coloring is apt to be occurred due to improper destruction of the microcapsules, and therefore great pressure is required in developing the recording paper.

Conventionally, photo- and pressure-sensitive recording paper has a support coated with a layer of microcapsules each enclosing a dye precursor composed of a substance having hardness changeable corresponding to a quantity of irradiation with light and coated also with a developer. Then, the microcapsules which have been variously changed in hardness corresponding to the varieties of quantity of light irradiation are destroyed to an extent corresponding to the variously changed hardness, so that changes in state of reaction between the microcapsules and the dye precursor caused corresponding to the extent of the destroy, and hence resulting changes in density of a developed picture, is utilized to perform development. This is a principle of development utilized for the conventional photo- and pressure-sensitive recording paper. In such conventional photo- and pressure-sensitive recording paper, microcapsules have been used only for the dye precursor and the developer has been directly applied on the support.

Therefore, if the microcapsules enclosing the dye precursor were destroyed for some reasons, for example, by accidental application of pressure, coloring was caused at portions where the microcapsules were destroyed. This tendency of the conventional photo- and pressure-sensitive recording paper makes it difficult to handle the paper. The conventional photo- and pressure-sensitive recording paper has a further disadvantage that it has to be processed by a large-sized pressure developing apparatus because high pressure is required for the destruction of the microcapsules.

SUMMARY OF THE INVENTION

It is therefore an object of the present invention to eliminate the disadvantages in the prior art.

It is another object of the present invention to improve the photo- and pressure-sensitive recording paper so as control the reaction between a dye precursor and a developer.

It is a further object of the present invention to provide improved photo- and pressure-sensitive recording paper which is easy in handle and in which development can be performed with relatively low pressure.

It is a still further object of the present invention to provide a pressure developing apparatus which is suitable to such improved photo- and pressure-sensitive recording paper.

In order to achieve the above object, according to an aspect of the present invention, the photo- and pressure-sensitive recording paper comprises a support coated with first microcapsules each enclosing contents including a substance which has hardness changeable corresponding to a quantity of light irradiation thereon and which includes a dye precursor, and with second microcapsules each enclosing a developer which is a thermoplastic substance.

According to another aspect of the present invention, the pressure developing apparatus suitable for pressure developing the photo- and pressure-sensitive recording paper according to the one aspect of the invention comprises rollers for applying pressure to the photo- and pressure-sensitive recording paper, and heaters for heating the rollers.

These and other objects, features and advantages of the present invention will become apparent upon a reading of the following detailed description and accompanying drawings.

DESCRIPTION OF THE PREFERRED EMBODIMENTS

Figure 1:
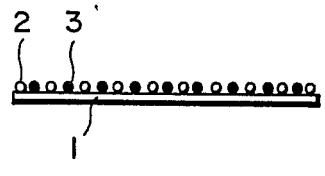
FIG. 1 is an explanatory view to show the structure of the photo- and pressure-sensitive recording paper according to the invention.

Referring to the drawings, embodiments of the present invention will be described hereunder.

FIG. 1 is a model diagram showing the structure of an embodiment of the photo- and pressure-sensitive recording paper according to the invention. In the drawing, a support 1 is coated with first microcapsules 2 and second microcapsules 3.

As a material for the support 1, paper, plastic or any other suitable material may be used.

Figure 2:
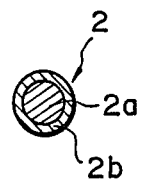
FIGS. 2 and 3 are explanatory views to illustrate the structure of a microcapsule of the photo- and pressure-sensitive recording paper according to the invention.

As shown in FIG. 2, the respective microcapsule 2 is constituted by a portion 2b made of thermoplastic resin and contents 2a enclosed by the thermoplastic resin portion 2b, the contents including a substance having hardness changeable when irradiated with light and enclosing the contents 2a. Specifically, in the contents 2a of the microcapsule 2, a dye precursor is included in the substance changeable in hardness when irradiated with light, and a photo-polymerization initiator is included in addition to the substance having the changeable hardness, so that developing is performed when the contents 2a are brought into contact with a developer which will be described later.

Figure 3:
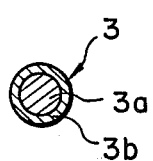

As shown in FIG. 3, the respective microcapsule 3 is constituted by a developer 3a which is a thermoplastic substance, and a portion 3b made of thermoplastic resin enclosing the developer 3a. When the microcapsule 3 is heated, both the surface and the contents thereof are softened so as to be able to be easily destroyed by low pressure applied thereto.

To form a picture on the photo- and pressure-sensitive recording paper, the recording paper is exposed to light (ultraviolet rays) with varieties of intensity corresponding to the contents of the original by a proper exposure mechanism. Through this process, the microcapsules 2 on the photo- and pressure-sensitive recording paper variously change in hardness so that a latent image is formed in accordance with the varieties of intensity of exposure.

Upon application of pressure onto the photo- and pressure-sensitive recording paper having the latent image formed corresponding to the variety of changes in hardness of the microcapsules 2, the microcapsules which have not been hardened are destroyed. If a developer is present at that time, colors will develop to produce a visible image or picture.

In the conventional photo- and pressure-sensitive recording paper, microcapsules have been formed only for dye precursors and a developer has been applied directly onto the support. As a result, if the microcapsules of the dye precursor are destroyed for some reasons, undesirable coloring often takes place. To prevent such undesirable coloring from occurring, according to the invention, a developer is composed of a thermoplastic substance which is not liable to destruction at an ordinary temperature and the developer is enclosed with thermoplastic resin in the form of microcapsules. Therefore, even if the microcapsules 2 of photo- and pressure-sensitive recording paper are destroyed inadvertently as described above, coloring will not be effected. If pressure is applied to the photo- and pressure-sensitive recording paper while the paper is heated, the microcapsules 3 as well as the microcapsules 2 can be destroyed to allow colors to develop to thereby form a visible image or picture.

This means than undesirable coloring can be prevented from occurring, and that only by applying pressure to the recording paper while heating the same, satisfactory development can be performed to form a visible image or picture.

In use of the photo- and pressure-sensitive recording paper according to the invention, if the microcapsules of a dye precursor are destroyed before the exposure and developing process, the dye precursor may contact the developer which has been reactive to cause undesirable coloring in the developing process. Such undesirable coloring can be prevented if the dye precursor which has flowed out of the destroyed microcapsules is made less liable to reaction in advance either by heating the recording paper once before proceeding to the developing process to thereby sublimate the flowed-out dye precursor or by prolonging the exposure time a little to harden the dye precursor. By taking such measures in the picture forming process, it is possible to improve the quality of a picture obtainable with the photo- and pressure-sensitive recording paper according to the present invention.

Figure 4:
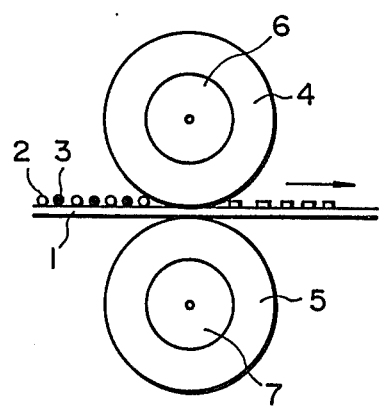
FIG. 4 is a schematic diagram showing the structure of the pressure developing apparatus according to the invention.

FIG. 4 shows the basic structure of an embodiment of the pressure developing apparatus suitable for developing the photo- and pressure-sensitive recording paper according to the invention. Ordinary pressure rollers 4 and 5 incorporate heaters 6 and 7 respectively, so that the pressure rollers 4 and 5 apply pressure to the photo- and pressure-sensitive recording paper while softening the thermoplastic substace enclosing the microcapsules 3 to thereby achieve sufficient destruction of the microcapsules 3. The heaters 6 and 7 are not necessarily required to be incorporated respectively within the rollers 4 and 5 but may be disposed in the circumference of the rollers so as to utilize heat given through heat radiation or conduction.

As described above, undesirable coloring in recording paper can be prevented from occurring by the use of the photo-paper and pressure-sensitive recording paper according to the present invention, and a good-quality picture can be obtained by the use of the pressure developing apparatus according to the present invention which is suitable for developing the above-mentioned photo- and pressure-sensitive recording paper according to the present invention.

What is claimed is:

1. A photo- and pressure-sensitive recording paper comprising:
   a support;
   first microcapsules applied on said support each enclosing a dye precursor and including a substance which has a hardness changeable corresponding to a quantity of light irradiation thereon; and
   second microcapsules applied on said support each enclosing a developer which is a thermoplastic substance whereby said dye precursor and developer can only react when said first microcapsules are subjected to a sufficient force to rupture and thereby release said dye precursor and said second microcapsules are subjected to sufficient heat to release said developer.

2. A photo- and pressure-sensitive recording paper according to claim 1, in which the contents of each of said first microcapsules further includes a photo-polymerization initiator, and in which said first and second microcapsules are made of a thermoplastic resin.

* * * * *